United States Patent [19]

Biegelsen et al.

[11] Patent Number: 4,542,397
[45] Date of Patent: Sep. 17, 1985

[54] SELF ALIGNING SMALL SCALE INTEGRATED CIRCUIT SEMICONDUCTOR CHIPS TO FORM LARGE AREA ARRAYS

[75] Inventors: David K. Biegelsen, Portola Valley; Dirk J. Bartelink, Los Altos, both of Calif.

[73] Assignee: Xerox Corporation, Stamford, Conn.

[21] Appl. No.: 599,427

[22] Filed: Apr. 12, 1984

[51] Int. Cl.[4] .................. H01L 25/04; H01L 21/302; H01L 21/98

[52] U.S. Cl. ........................ 357/32; 29/580; 29/583; 29/589; 148/33; 148/DIG. 28; 250/553; 156/657; 340/719

[58] Field of Search .............. 29/580, 583, 589, 590; 148/DIG. 28; 156/657; 357/31, 32, 75, 40, 45; 250/332, 553; 340/700, 719

[56] References Cited

U.S. PATENT DOCUMENTS

| | | | |
|---|---|---|---|
| 3,301,716 | 1/1967 | Kleinknecht | 148/1.5 |
| 3,869,787 | 3/1975 | Umbaugh | 29/577 |
| 3,870,850 | 3/1975 | Larionov et al. | 219/85 |
| 3,977,071 | 8/1976 | Jarman | 29/589 X |
| 4,170,021 | 10/1979 | DuBois et al. | 357/55 |
| 4,253,280 | 3/1981 | DuBois et al. | 51/283 R |
| 4,278,897 | 7/1981 | Ohno et al. | 307/455 |

OTHER PUBLICATIONS

"Anisotropic Etching of Silicon", Kenneth E. Bean, IEEE Transactions on Electron Devices, vol. ED-25(10), Oct. 1978, pp. 1185–1193.
James B. Angell et al., "Silicon Micromechanical Devices", Scientific American, pp. 44–55, Apr. 1983.

Primary Examiner—Brian E. Hearn
Assistant Examiner—Alan E. Schiavelli
Attorney, Agent, or Firm—W. Douglas Carothers, Jr.

[57] ABSTRACT

Small scale integrated chips are fabricated from a semiconductor wafer and subsequently pretested and formed into large area arrays with self aligning and self locking characteristics due to the axial orientation of the semiconductor wafer and geometries employed for the chips based upon the wafer orientation, whereby the spacing of abutting chip edges in an array may be less than 7 μm. The chips are fabricated from <110> axial wafer, e.g., silicon <110> axial wafer, wherein the chip boundaries are aligned with vertical {111} planes of the crystalline material so that each of the chips formed from the wafer may be defined within parallelogrammatic like geometries defined by these planes and their intersections. The term "parallelogrammatic like geometries" means all geometric shapes capable of being formed with various vertical {111} planes within the crystalline structure of the wafer. Examples of such shapes are parallelograms of various aspect ratios and variations or combinations of planar figures composed of parallelograms. Specific examples of geometries are diamond shaped or chevron shaped configurations.

12 Claims, 6 Drawing Figures

SELF ALIGNING SMALL SCALE INTEGRATED CIRCUIT SEMICONDUCTOR CHIPS TO FORM LARGE AREA ARRAYS

BACKGROUND OF THE INVENTION

This invention relates to the alignment of small scale integrated circuit semiconductor chips into a two dimensional array and more particularly to forming small scale integrated circuit semiconductor chips from a semiconductor wafer having a preferred geometry to enhance the automatic self alignment and self locking of a plurality of such chips into such an array to within acceptable tolerances.

It has long been felt that there is no acceptable yet simple and inexpensive method of abutting or aligning semiconductor chips and interconnecting them to effectively produce large two dimensional arrays. There is a demand for large area arrays for various applications such as displays, image bars or extended electronic array each of which may be composed of abutted and electrically bonded chips comprising several inches on one or more sides of the array. However, attempts in the past to make such arrays have failed principally due to the fact that the alignment of the chips to form such arrays cannot be aligned or abutted sufficiently close together to form a visually contiguous array with adjacent array chips bondable together at points of metalization connection. Conventionally, integrated circuit chips formed from wafer die are sawed in appropriate pieces and may be aligned together in a jig, table or other such support structure. In general, sawed chips cannot be successfully abutted together more than about 10 μm. This is a disadvantage to the extent that studies have revealed that spacing between chips in an array must be better than 7 μm in order for the line appearance between chip edges not to be visible to the naked eye. This would be particularly significant in a line scan solid state display comprising a plurality of individually aligned chips. The visual appearance of chip edge lines would be disruptive of the display resolution.

At the present time, there is an emphasis to fabricate large area circuits on a single semiconductor wafer such as a 3 inch or 5 inch silicon wafers. This technology is referred to as "wafer scale integration" and requires high quality fabrication of the circuits. Yields may be low due to failure of too many circuits on a single wafer, which circuits cannot be replaced. Here lies the advantage of small scale integrated circuit discrete chips that may be independently pretested before being abutted and bonded into two dimensional large area array.

This invention permits the formation and use of small scale integrated circuit chips into large two dimensional arrays in a manner that the chips may be brought into abutting relationship with less than a 7 μm spacing between abutting chip edges in a large area array.

SUMMARY OF THE INVENTION

According to this invention, small scale integrated chips are fabricated from a semiconductor wafer and subsequently pretested and formed into large area arrays with self aligning and self locking characteristics due to the axial orientation of the semiconductor wafer and geometries employed for the chips based upon the wafer orientation, whereby the spacing of abutting chip edges in an array may be less than 7 μm. The chips are fabricated from <110> axial wafer, e.g., silicon <110> axial wafer, wherein the chip boundaries are aligned with vertical {111} planes of the crystalline material so that each of the chips formed from the wafer may be defined within parallelogrammatic like geometries defined by these planes and their intersections. By the term "parallelogrammatic like geometries" we mean all geometric shapes capable of being formed with various vertical {111} planes within the crystalline structure of the wafer. Examples of such shapes are parallograms of various aspect ratios and variations or combinations of planar figures composed of parallelograms. Specific examples of geometries are diamond shaped or chevron shaped configurations.

By employing conventional photolithographic and selective etching techniques, a plurality of small scale integrated circuits may be formed on a major surface of a <110> axial wafer within predetermined latent boundaries, which boundaries are aligned with the {111} planes. These planes are perpendicular to the major surfaces of the wafer and are prescribed on the wafer surface in the form of parallelogrammatic like geometries, the surfaces of which are the resultant IC chip pieces or die. Using conventional photolithography, a photoresist pattern is formed on a previously formed etch stop layer or coating on a major wafer surface. With exposure and removal of the photoresist along the predetermined latent boundaries followed by anisotropic etching, e.g., potassium hydroxide (KOH), forming highly accurate straight vertical wall boundaries along selected {111} planes may be formed with the intersection of such planes delineating the regions representing integrated circuit chips.

The formed chips may be arranged in very tightly packed two dimensional large area array by initially being placed on a planar support surface in rough approximation of their desired array geometry followed by lateral compaction of the chips together in self aligning and self locking relationship. Due to the identically formed side walls of each chip being along the {111} planes, the chips upon compaction will self align and interlock into a tight two dimensional array with spacing betwen chip edges being less than 7 μm.

The chips are held in alignment until bonded as a whole to a planar support slab or substrate.

Other objects, features and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
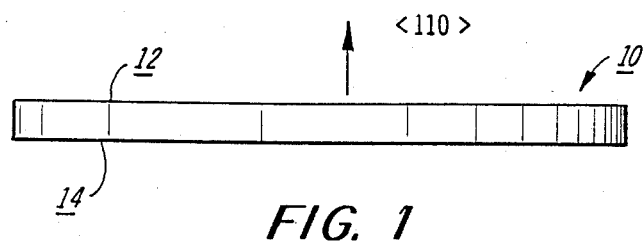
FIG. 1 is a side view of a <110> axial wafer of semiconductor crystalline material.
Figure 2:
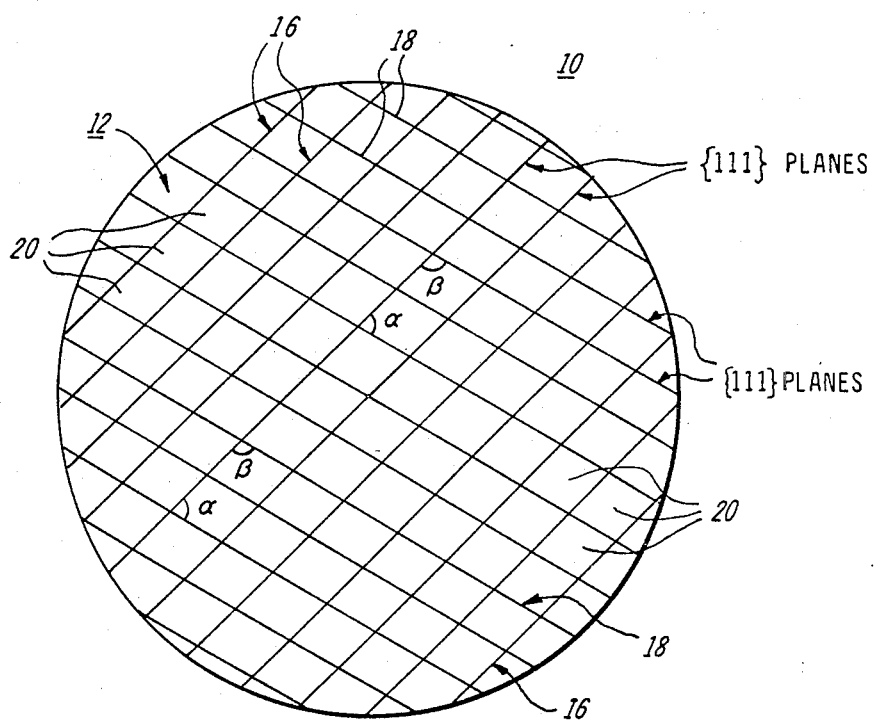
FIG. 2 is plan view of a major surface of the <110> axial wafer of FIG. 1 illustrating predetermined latent boundaries on the wafer surface aligned with the {111} vertical planes defining parallelogrammatic like geometries.

As shown in FIGS. 1 and 2, there is illustrated a wafer of semiconductor material having two opposed major surfaces 12 and 14. The semiconductor material comprising body 10 may be silicon, germanium, GaAs, CdSe, a compound of a Group II element and a Group VI element, or a compound of a Group III element and Group V element. For the purpose of description of the invention, the wafer 10 will be referred to as silicon. However, the technique disclosed is applicable in principal for most crystalline materials and is not restricted to silicon.

For application of the teachings of this invention, the wafer 10 must have a <110> axial orientation within about 0.1°. As is well known in such an orientation, the silicon lattice boundaries form {111} vertical planes perpendicular to major surfaces 12 and 14. The {111} planes are vertical through the wafer 10 and intersect each other with angles $\alpha$ and $\beta$ wherein $\alpha$ equals 70.6° and $\beta$ equals 109.4°. With conventional photolithographic and selective etching techniques, a plurality of chips having accurate dimensions and accurately vertical and very flat side edges may be formed along selected boundaries of these planes. The accuracy of the formed chips is sufficient to render chip boundaries invisible to the naked eye, that is, the spacing between chip edges can be reduced to less than 7 $\mu$m, for example, as much as a minimum of 2 $\mu$m to 5 $\mu$m spacing.

In FIG. 2, the surface of wafer 10 has been latently marked off via imaginary lines 16 and 18 along the {111} vertical planes forming uniform sized parallelogrammatic like shapes, that is, parallelograms shapes according to the crystal orientation angles $\alpha$ and $\beta$. As known in the art, the specific wafer 10 axial orientation designation may be referred to as <110>, so that the nomenclature for the vertical planes is {111} for the planes represented by lines 16 and {111} for the planes represented by lines 18.

The lines 16 and 18 are intended as latent in this illustration so that a framework or grid pattern is created within which integrated circuits may be formed into the identical planar regions 20 of the wafer using conventional silicon processing. The circuits formed in regions 20 may be all identical to or different from adjacent regions, dependent upon the particular application. In an image array or display application comprising a plurality of image sensors or display switches in an array comprising of plurality of elements, the regions 20 may be formed of identical circuits separated by the boundaries represented by latent lines 16 and 18.

After silicon processing, the wafer 10 is ready for processing into discrete chips 30 comprising the regions 20. Well known anisotropic etching and photolithographic techniques may be employed. See, for example, the Articles of Kenneth E. Bean, "Anisotropic Etching of Silicon",*IEEE Transactions on Electron Devices*, Vol. ED-25, No. 10, pp. 1185–1193 (October, 1978) and James B. Angell et al., "Silicon Micromechanical Devices", *Scientific American*, pp. 44–55 (April, 1983). Conventionally, an etch stop layer or coating, e.g. $Si_3N_4$, impervious to the etchant to be employed, is deposited on the wafer surface 12. A photoresist is then disposed on this surface and exposed relative to the grid pattern represented by the latent lines 16 and 18. The exposed photoresist may be either dry etched or wet etched. Well known anisotropic etches may be employed. In the case of a wet etch, potassium hydroxide (KOH) may be employed. In the case of a dry etch, plasma etching may be employed. The anistropic etching follows the vertical {111} planes that are perpendicular to the surfaces 12 and 14 of wafer 10.

The etch may be carried out all the way through these wafer vertical walls forming the discrete chips 30 with side walls of length, L, except for incomplete and unusable portions along the perimeter of wafer 10. Alternatively, the anistropic etch may be performed part way through the wafer via surface 12 and then the remaining portions may be completed by cleaving.

After completion of this selective etch step, the photoresist on the surfaces of the chips is removed, for example, by immersion of the chips in concentrated sulphuric acid at 180° C. or by immersion in a mixture 1 part by volume hydrogen peroxide and 1 part by volume concentrated sulphuric acid. This is followed by removal of the stop etch layer, if desired.

The chips are essentially flat surfaces bound by atomically flat perpendicular edges due to the fact that the anistropic etch will stop on the resist protected boundary {111} planes with substantially atomic sharp corners where these planes intersect forming an inside or outside corner. The outside corner, however, will be formed with a rounded edge which can be compensated by the technique formed in the photresist mask as disclosed in the article, for example, of Kenneth E. Bean, supra relating to corner compensation. This rounding effect on outside corners is particularly unsuitable where metallization in a formed chip region 20 comes out to a chip edge for adjacent chip or off chip connection at the particular point of rounding.

Figure 3:
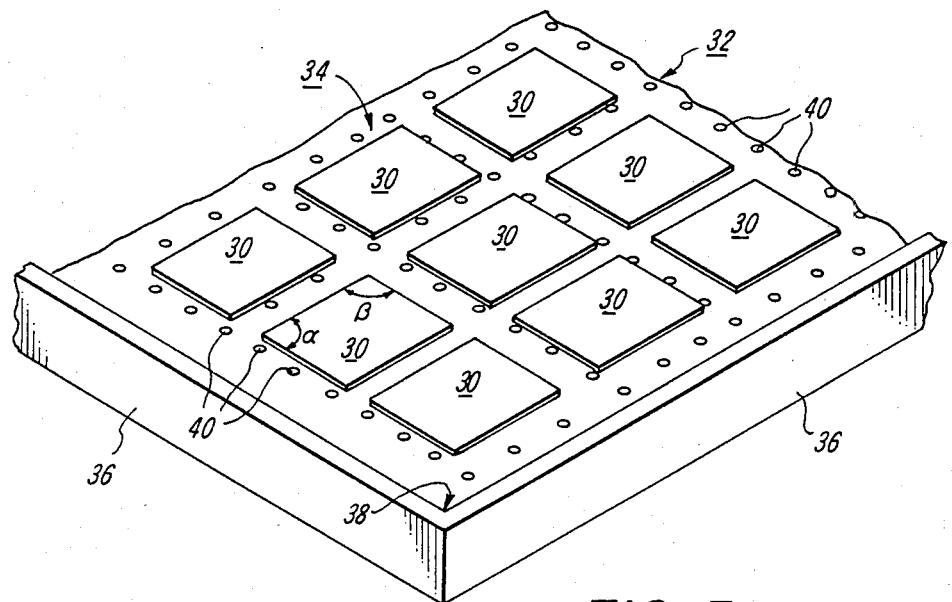
FIG. 3 represents a planar array of small scale integrated circuit chips selectively etched from the wafer of FIG. 2 before compaction.

As previously mentioned, the parallelogrammatic like shapes of chips 30 shown in FIG. 3 are discrete, identical parallelograms. The basic notion is that the chips 30 may be pretested to ensure their electrical properties and characteristics are proper that each chip circuit is proven to be operational. In this manner, the integrated circuit chips 30 may be determined operational prior to their assembly into a two dimensional large area array.

FIG. 3 illustrates the chips 30 loosely but positioned in nearly correct alignment on a planar support surface 34 of an assembly table structure 32. Structure 32 is provided with a side rail 36 on at least two sides thereof. By compacting the chips laterally, toward corner 38 of structure 32 for example, the chip pieces will "automatically" self align and self interlock with one another and the spacings between the chip pieces may be reduced to a minimum of $\leq$ 2 $\mu$m. This compacting is illustrated as complete in FIG. 4, forming the two dimensional chip array 42.

Compaction may be achieved in a manner known in the art for vibrating workpieces for purposes of workpiece movement and transfer. Examples of such compaction are mechanical vibration of the table structure 32 or employment of pulsated air through apertures 40 in the support surface 32. In these cases, the table structure 32 may be a gravity driven shaker table tilted from the horizontal toward table corner 38 so that lateral compaction of all chip pieces is toward and into this corner during compaction. Lateral compaction of the chips may be further enhanced by simultaneous application of lateral pressure to the outermost chip pieces of the array on at least two sides of the array. Such lateral force may be in the form of spring biased flat rails or bars similar to side rails 36 but biased to press inwardly along the other adjacent edges of the array, opposite to rails 36 (not shown), during compaction. Compaction may be further enhanced by the positioning of a uniform weighting plate on the top surface of the chip pieces, such as a glass sheet. The planar support surface and top weighting plate, if employed, may be fabricated with micron size cross channels or microgrooves to form a checkerboard or criss cross channel structure in their surfaces to effectively remove microchip particles or chip dust that may be formed during the compaction process. The grooves may be V-shaped grooves or U-shaped grooves.

Figure 4:
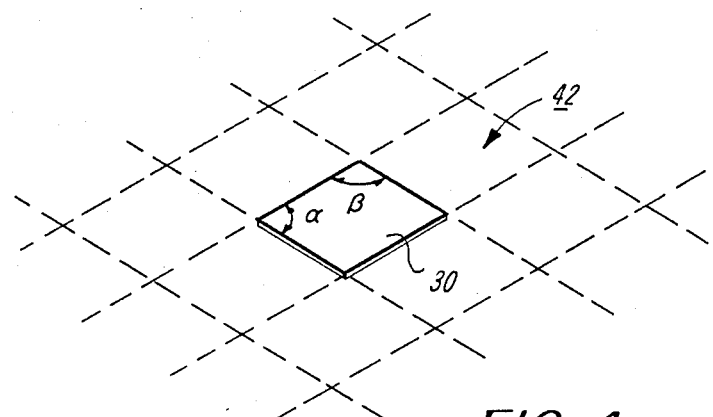
FIG. 4 represents the self alignment and self locking of the chips of FIG. 3 after compaction.

Once final compaction has been achieved, as illustrated in FIG. 4, a vacuum may be applied via apertures 40 from beneath the surface 34. The chips may then be directly bonded to a substrate or support slab followed by metal bridging of the chips at points of off-chip electrical connection to adjacent array chips. Alternatively, wire bonding may be initially accomplished between the array chips while maintaining the vacuum on the array via apertures 40 from beneath the surface 34. The wire bonding will hold the chips together in the array 42 after release of the vacuum, at which time the bottom of the two dimensional array is then bonded to planar support pad or substrate by means of epoxy or other embedding material. Metal bridging of adjacent chip connections may achieved using conventional methods known in the art, some of which are exemplified in U.S. Pat. Nos. 3,301,716 and 3,870,850.

Figure 5:
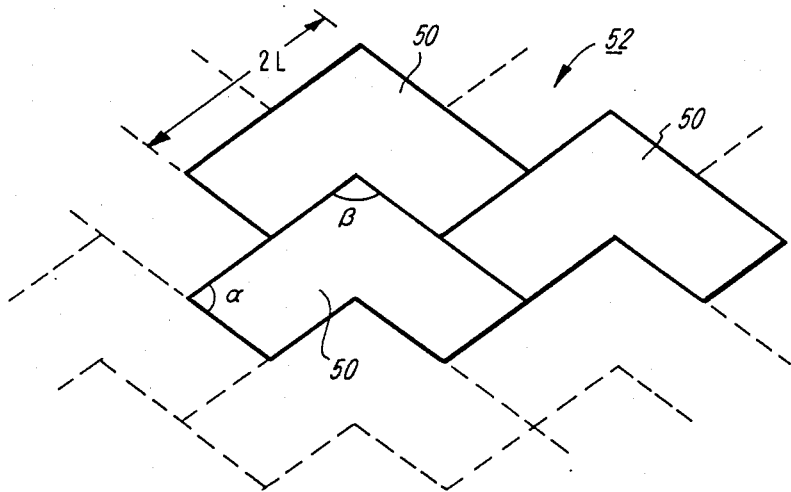
FIG. 5 illustrates another parallelogrammatic like shape of chips in accordance with this invention, the form shown being that of chevrons.
Figure 6:
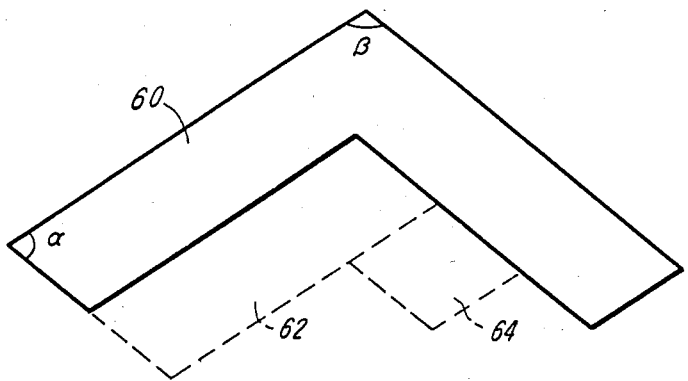
FIG. 6 illustrates a combination of parallelogrammatic like shapes of chips in accordance with this invention comprising a combination of different parallelogrammatic like shapes.

FIGS. 5 and 6 illustrate other parallelogrammatic like geometries and combinations of such shapes based upon the formation of such shapes along selected {111} vertical planes of the <110> axial wafer 10. The basic configuration is the parallelogram shape illustrated by chip 30 in FIG. 4.

However, this shape can be extended to form chips 50 having a chevron shape as shown in FIG. 5. The chevron shaped chips 50 provided a more enhanced self interlocking feature in forming the tightly packed array 52.

FIG. 6 illustrates three differently shaped parallelogrammatic like geometries employed in a portion of a single large area array, which is representative of variations of different kinds of planar figures composed of parallelograms. Shown in combination are chevron shaped chip 60, parallelogram chip 62 and diamond shaped chip 64. We refer to this as the chevron "aspect ratio" which can, in fact, be varied in many different kinds of combinations to utilize in various positions throughout the compacted array, for example, selected chevron shaped chips that enhance the interlocking effect through the lateral extent of the array.

The use of the <110> axial wafer for fabrication of small scale integrated chips having corners or edges at the angles $\alpha$ and $\beta$ will produce a two dimensional array forming oblique rows and columns in the array as illustrated by the dotted lines in FIGS. 4 and 5. While, in the past, it has been conventional to align chips in an orthogonal pattern, the oblique alignment pattern produced by necessity here is not a detriment since self alignment and final chip spacing can be minimized to range between 2 $\mu$m and 7 $\mu$m, which is below recognizable discretion of the human eye as well as insuring contact alignment sufficient for direct metal bridging of electrical connections between adjacent and aligned chips of the array.

In summary, we disclose the fabrication of identical small scale integrated circuit chip, parallelogrammatic like geometries from a single wafer of <110> orientation using conventional lithographic and anistropic techniques. Because of this wafer orientation and identically reproducible geometries, the chips may be aligned into a continuous linear or two dimensional array without producing objectionable spacing and gaps between adjacent chip edges.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. A method for self aligning small scale integrated circuit chips to form large area arrays comprising the steps of
   (a) providing a <110> axial wafer,
   (b) forming a plurality of small scale integrated circuits on a major surface of said wafer within predetermined latent boundaries on said wafer, said boundaries being aligned with the {111} vertical planes of the wafer whereby each formed circuit is defined within parallelogrammatic like geometries defined by said planes at said predetermined latent boundaries and their plane intersections,
   (c) selective anisotropically etching along said predetermined boundaries to form a plurality of independent small scale integrated chips comprising said parallelogrammatic like geometries,
   (d) initially forming said chips into a two dimensional array by placing said chips on a planar support surface in their nearly correct alignment,
   (e) laterally compacting said chips together in abutting relationship causing said chips to self align and self interlock into a two dimensional array, and
   (f) maintaining the compacted chips in aligned relation while bounding them to a planar support slab.

2. The method of claim 1 wherein said parallelogrammatic like geometries are selected from the geometric group consisting of parallelograms, diamonds, and chevrons.

3. The method of claim 1 wherein the step of compacting is achieved by mechanically vibrating said chips on said planar support table.

4. The method of claim 1 wherein the step of compacting is achieved by supplying pulsating air through apertures provided in said planar support surface.

5. The method of any one of the claims 1-4 wherein there is the additional step of applying lateral pressure along at least one edge of the compacted chips forming an outer perimeter of said array to enhance the compaction and alignment thereof.

6. The method of any one of the claims 1-4 wherein there is the additional step of tilting said planar support surface to enhance the compaction and alignment of said chips.

7. The method of claim 6 wherein there is the additional step of mechanically vibrating said chips on said planar support table.

8. The method of claim 6 wherein there is the additional step of supplying pulsating air through apertures provided in said planar support surface.

9. The method of claim 1 wherein the step of compacting of said chips to form said array achieves spacing of chip abutting edges to less than 7 μm.

10. The method of claim 1 wherein the spacing of chip abutting edges is within the range of 2 μm to 7 μm.

11. A large area array formed from a plurality of small scale integrated chips in self aligned and self interlocking abutment in accordance with the method of claim 1 wherein the spacing between adjacent chip edges of said array chips is less than 7 μm, said array chips fabricated from a <110> axial wafer wherein the chip boundaries are aligned with {111} vertical planes of said wafer so that each of said array chips may be defined within parallelogrammatic like geometries defined by said planes and their plane intersections.

12. The large area array of claim 11 wherein said parallelogrammatic like geometries are selected from the geometric group consisting of parallelograms, diamonds and chevrons.

* * * * *